United States Patent [19]
Harlan

[11] Patent Number: 5,156,681
[45] Date of Patent: Oct. 20, 1992

[54] PROCESS MODULE DISPENSE ARM

[75] Inventor: John M. Harlan, Austin, Tex.

[73] Assignee: Eaton Corporation, Cleveland, Ohio

[21] Appl. No.: 705,834

[22] Filed: May 28, 1991

[51] Int. Cl.⁵ .............................................. B05B 17/00
[52] U.S. Cl. .................................... 118/320; 118/323; 192/12 R
[58] Field of Search .............. 192/12 R; 118/320, 323

[56] References Cited

U.S. PATENT DOCUMENTS 4,515,256  5/1985  Kitano et al. ...................... 192/12 R
5,085,374  2/1992  Okuda et al. .......................... 118/323

FOREIGN PATENT DOCUMENTS 2416059  10/1979  France ................................. 118/323

Primary Examiner—W. Gary Jones
Assistant Examiner—Charles K. Friedman
Attorney, Agent, or Firm—F. M. Sajovec

[57] ABSTRACT

A drive mechanism which permits both rotational and vertical translation of a fluid dispense arm within a wafer processing system. A motor drives a brake/clutch coupling which, through selective actuation and the utilization of two drive gears, causes selective rotation and/or translation of an output shaft attached to the fluid dispense arm. Selective rotation and/or translation of the output shaft and the fluid dispense arm permits the use of the apparatus without modification of the spin deflector and associated baffling in the wafer processing area.

9 Claims, 4 Drawing Sheets

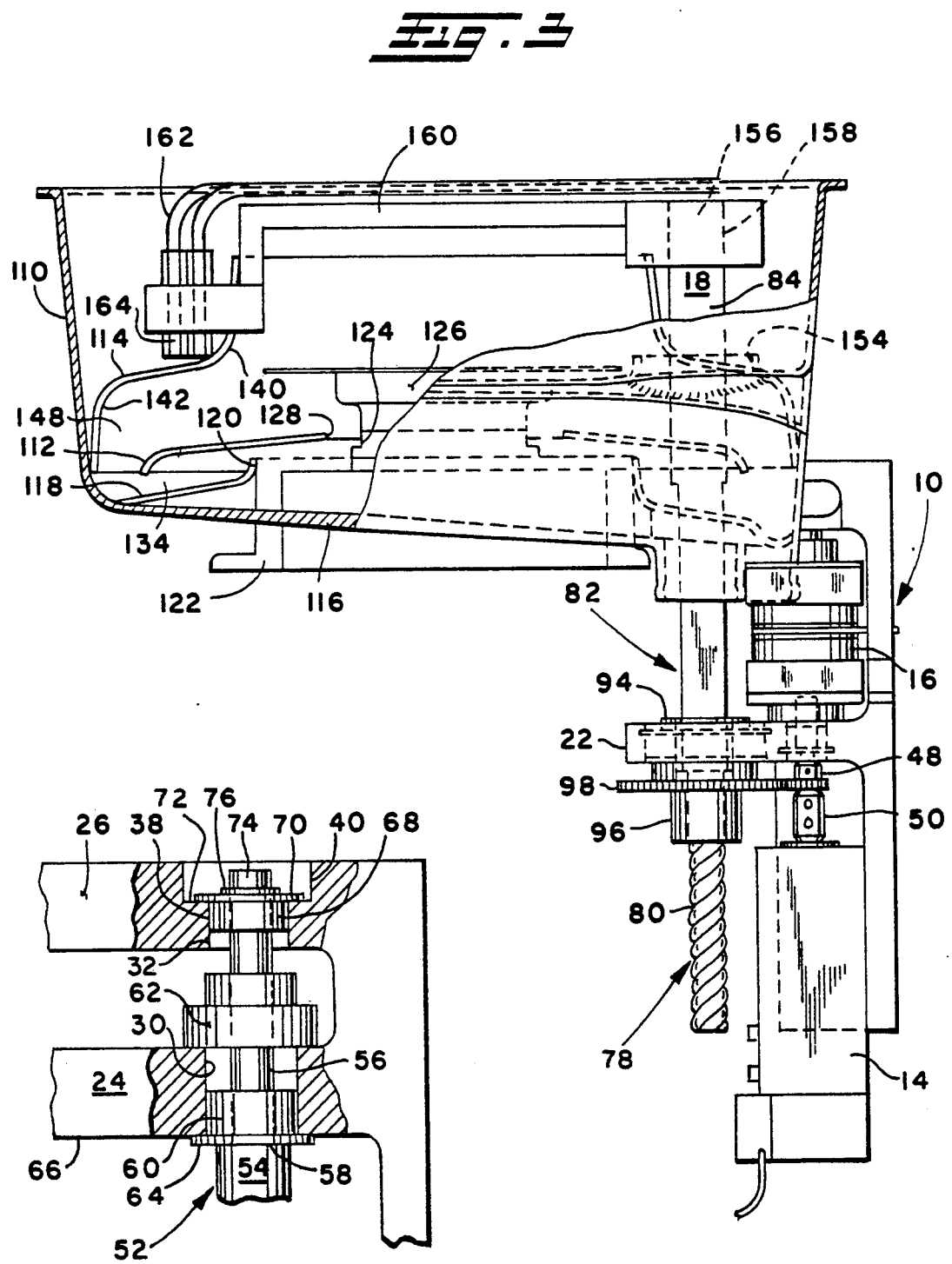

PROCESS MODULE DISPENSE ARM

The present invention relates, in general, to an arm for positioning tubes and/or nozzles which dispense fluids onto semi-conductor wafers undergoing various production processes in a wafer processing system and, more particularly, to a dispensing tube positioning arm which can be readily rotated and translated providing two degrees of freedom.

The production of integrated circuits on semi-conductor wafers requires that the wafers undergo a number of processes such as photoresist coating, developing, wafer scrubbing or baking, etc. Some of these processes require that a fluid be dispensed onto the surface of the semi-conductor wafer. In these cases, some type of apparatus must be provided for directing and/or dispensing the fluid onto the wafer in a manner such that the desired coverage of the wafer is obtained and such that the tubes and/or nozzles can be moved aside to provide access for wafer transfer between processing stations. It has been found that the control of air flow rates and patterns within the process chamber by using baffles, chamber shape and chamber enclosures to best advantage has a significant positive effect upon the degree of uniformity and consistency achievable with respect to the fluid applied coatings. In this regard, typical dispense apparatus have some inherent disadvantages. For example, presently available arms for directing and/or dispensing the fluids usually have only one degree of freedom, viz., rotational movement about the vertical axis or linear translation in the horizontal plane, and vertical displacement of the arm cannot be easily attained. The lack of ability to readily change the vertical displacement of the arm severely limits the operability of the arm since the arm cannot be easily raised to allow travel over the spin deflector and associated baffling in the process area. In order to circumvent this problem, structural modification with attendant design compromise of the foregoing deflector and baffle is required to permit motion of the arm between a storage space for same and the primary process environment. It has also been found that other operating parameters or characteristics associated with presently available arms for directing and/or dispensing fluids, such as arm positioning, arm rotation rates and air flow through the wafer processing system are limited by the design of the presently available arms.

The present invention provides a solution to the foregoing problems associated with presently available arms for directing and/or dispensing fluids by providing a drive mechanism which permits both rotational and vertical translation of the arm, thus providing two degrees of freedom for same. Rotational and vertical translation of the arm is provided through the use of one drive motor and a brake/clutch coupling which, through selective actuation and the utilization of two drive gears, causes rotation and/or translation of an output shaft attached to the dispense arm. When the clutch portion of the clutch/brake coupling is engaged and the brake portion thereof is disengaged, the input and output shaft of the clutch/brake coupling are electro-mechanically connected causing rotation of both drive gears resulting in the rotation of the output shaft and dispense arm without translational movement thereof. If, however, the output shaft of the clutch/brake coupling is prevented from rotating, and the clutch portion thereof is disengaged, one of the drive gears and the output shaft are prevented from rotating permitting translational movement of the output shaft and the dispense arm. In this manner, selective rotation and/or translation of the output shaft and the dispense arm can be achieved. Since the apparatus of the present invention provides translational as well as rotational movement of the arm, modification of the spin deflector and associated baffling in the process area is not required. Furthermore, this degree of movement is achieved with the requirement for only a single, circular opening for the apparatus to enter the process chamber.

In accordance with the above, the primary object of the present invention is to provide apparatus whereby the rotation or translation of an output shaft can be selectively chosen.

Another object of the present invention is to provide apparatus which provides selective rotational or translational movement of an output shaft while utilizing one drive motor for same.

Another object of the present invention is to provide apparatus which provides selective rotational or translational movement of an output shaft and which can fit within a limited volume.

Another object of the present invention is to provide apparatus whereby the rotation or translation of the output shaft is determined by the selective actuation of a clutch/brake coupling.

Another object of the present invention is to provide apparatus for the selective rotation or translation of an arm for directing and/or dispensing fluids whereby vertical translation of the arm permits the arm to readily pass over the spin deflector and baffle structure associated with the process chamber in the wafer processing system.

Another object of the present invention is to provide apparatus for the selective rotation or translation of an arm for directing and/or dispensing fluids and which can fit into a limited volume adjacent the process chamber in the wafer processing system.

Another object of the present invention is to provide apparatus for the selective rotation or translation of an arm for directing and/or dispensing fluids and which requires only a single, circular entry to the process area of a wafer processing system.

Other objects and advantages of the present invention will become more apparent during the course of the following description when taken in conjunction with the accompanying drawings.

BRIEF DESCRIPTION OF THE DRAWINGS

In the drawings, wherein like numerals are employed to designate like parts throughout the same:

FIG. 2 is an enlarged fragmentary view, partially broken away in cross-section, illustrating the output end of the clutch/brake coupling utilized by the present invention and showing the frame structure which supports same.

FIG. 3 is a front elevation view of the present invention, partially broken way in cross-section, illustrating its use in conjunction with a process module in a wafer processing system.

DETAILED DESCRIPTION OF THE DRAWINGS

Figure 1:
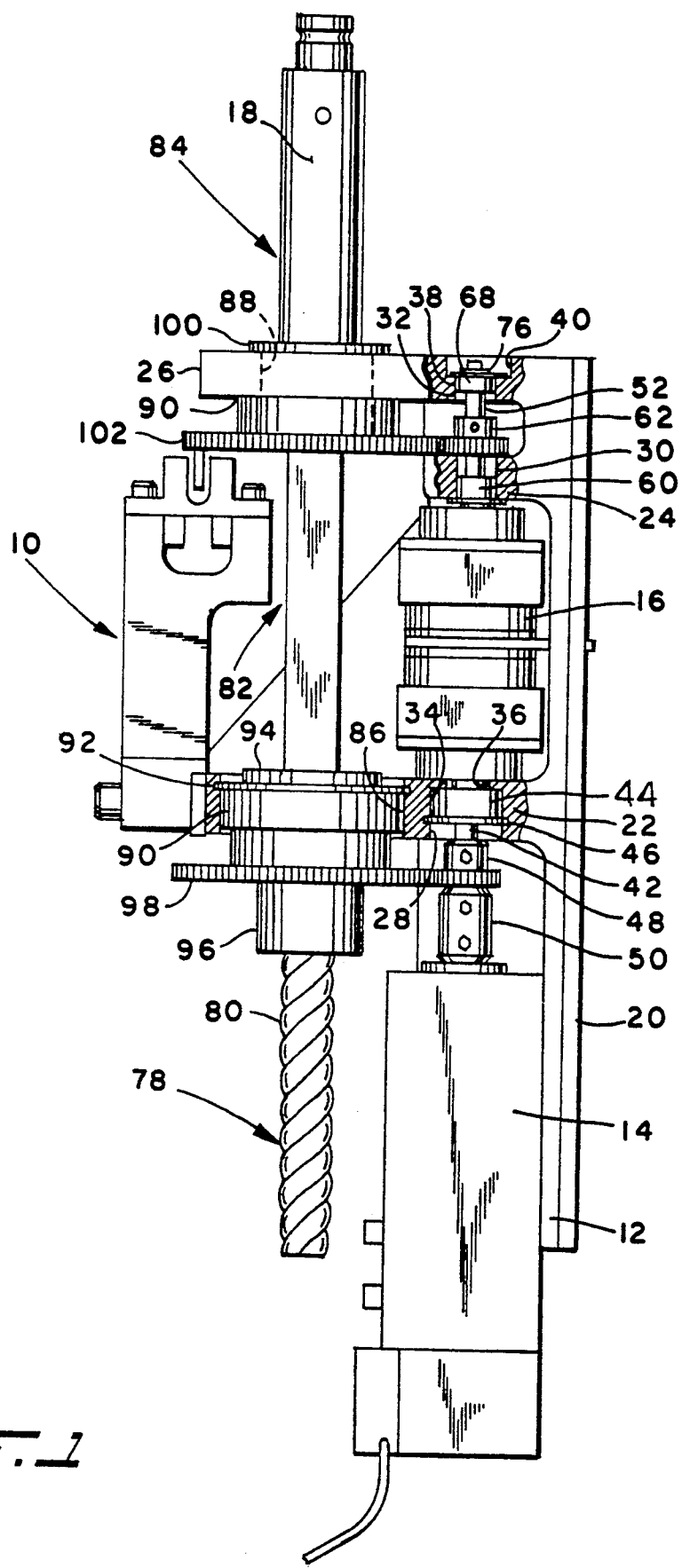
FIG. 1 is a front plan view, partially broken away in cross-section, showing the drive mechanism of the present invention.

Referring now to the drawings where the illustrations are for the purpose of describing the preferred embodiment of the present invention and are not intended to limit the invention described herein, FIG. 1 is a front plan view, partially broken away in cross-section, showing the drive mechanism 10 of the present invention. The drive mechanism 10 includes a frame 12, a drive motor 14, and an electrical clutch/brake coupling 16 which, through a gearing arrangement, rotationally and translationally drives an output shaft 18 that is movable within the frame 12.

The frame 12 includes a base portion 20 and three spaced-apart substantially upright members 22, 24 and 26 attached thereto. Upright member 24 is interposed between the upright members 22 and 26 and is positioned in closer proximity to upright member 26 than to upright member 22. The heights of upright members 22 and 26 are substantially the same and greater than the height of upright member 24. The longitudinal distance between upright members 22 and 24 approximates the overall axial length of the housing for the clutch/brake coupling 16. Axially aligned bores 28, 30 and 32 are provided in upright members 22, 24 and 26, respectively. Bore 28 in upright member 22 is stepped so as to provide a first bore portion 34 and a second bore portion 36; the diameter of first bore portion 34 being greater than the diameter of second bore portion 36. Similarly, bore 32 in upright member 26 is stepped so as to provide a first bore portion 38 and a second bore portion 40; the diameter of first bore portion 38 being less than the diameter of second bore portion 40. The diameter of bore 30 in upright member 24 is substantially constant throughout. The input shaft 42 of the clutch/brake coupling 16 is received through and rotationally supported by a ball bearing 44 received within first bore portion 34 of bore 28 in upright member 22. Ball bearing 44 is retained within first bore portion 34 of bore 28 by a retaining ring 46. The end of the input shaft 42 is received through the bore in a spur gear 48 which is affixed to the shaft 42 by fasteners received through the hub of the gear. The input shaft 42 of the clutch/brake coupling 16 is connected to the output shaft of the drive motor 14 by means of a coupling 50. Referring now to FIG. 2, the output shaft 52 of the clutch/brake coupling 16 has a first diameter portion 54 and a second diameter 56 with a circumferential shoulder 58 at their junction. The second diameter portion 56 of output shaft 52 is received through and rotationally supported by a flanged ball bearing 60 positioned within bore 30 in upright member 24 and is also received through the bore in a spur gear 62 positioned between upright members 24 and 26. The flanged portion 64 of ball bearing 60 is positioned against surface 66 of upright member 24. The circumferential shoulder 58 formed at the junction of first diameter portion 54 and second diameter portion 56 engages the flanged portion 64 of ball bearing 60. The spur gear 62 is affixed to the second diameter portion 56 of output shaft 52 by fasteners received through the hub of the gear. The second diameter portion 56 of output shaft 52 of the clutch/brake coupling 16 is rotationally supported by a flanged ball bearing 68 received within first bore portion 38 of bore 32 in upright member 26. The flanged portion 70 of ball bearing 68 is positioned against the circumferential shoulder 72 formed by the junction of first bore portion 38 and second bore portion 40. The end 74 of the second diameter portion 56 of output shaft 52 has a circumferential groove formed therein which receives a retaining ring 76 resulting in ring 76 firmly contacting the flanged portion 70 of ball bearing 68. In this manner, bearings 60 and 68 are constrained with respect to axial movement by circumferential shoulder 58 which is formed at the junction of first diameter portion 54 and second diameter portion 56 of output shaft 52 and which bears against the inner race of bearing 60 and by retaining ring 76 which bears against the inner race of bearing 68.

Referring again to FIG. 1, the output shaft 18 is comprised of a first portion 78 in the form of a lead screw 80, a second portion 82 having a substantially square cross-section and a third portion 84 having a substantially round cross-section. The output shaft 18 is received through bores 86 and 88 in upright members 22 and 26, respectively, and positioned such that the first portion 78 of output shaft 18 is located substantially outwardly of upright member 22; the second portion 82 of output shaft 18 is interposed substantially between upright members 22 and 26; and the third portion 84 of the output shaft 18 is located substantially outwardly of upright member 26. A ball bearing 90 is positioned within bore 86 in upright member 22 and is retained therein by a retaining ring 92. A flanged bushing 94 is received within the bore of ball bearing 90 and is positioned such that its flanged portion is adjacent the inner race of bearing 90. The opposite end of bushing 94 threadedly receives a lead nut 96 which threadedly engages the lead screw portion 80 of the output shaft 18. Bushing 94 is received through the bore in a drive gear 98 positioned outwardly of upright member 22. Drive gear 98 is affixed to the bushing 94 by fasteners received through the hub of the gear. The drive gear 98 is aligned with spur gear 48 so that their respective teeth are in intermeshing engagement. The second portion 82 of output shaft 18 is slidingly received through the bore in a flanged bushing 100 received within bore 88 in upright portion 26. The second portion 82 of output shaft 18 permits torque transfer, i.e., rotation of the output shaft 18, while permitting translational movement thereof, as hereinafter described. To this end, the second portion 82 of the output shaft 18 can utilize any of a number of arrangements, such as a ball-spline arrangement provided that the resulting design permits torque transfer while allowing translational movement of the output shaft 18. To accomplish torque transfer, the bore within the bushing 100 is stepped and has a first portion that is substantially square in cross-section and sized so as to be capable of receiving the second portion 82 of output shaft 18 and a second portion that is substantially round in cross-section and sized so as to provide a clearance fit with third portion 84 of output shaft 18. Bushing 100 is received through the bore in a drive gear 102 positioned so that its hub is adjacent upright member 26. Drive gear 102 is affixed to the bushing 100 by fasteners received through the hub of the gear. The drive gear 102 is aligned with spur gear 62 so that their respective teeth are in intermeshing engagement.

Operationally, when the clutch portion of the clutch/brake coupling 16 is engaged and the brake portion thereof is disengaged, the input shaft 42 and the output shaft 52 of the clutch/brake coupling 16 are electro-mechanically-connected causing rotation of both drive gears 98 and 102 resulting in the rotation of output shaft 18 without translational movement thereof. If, however, the output shaft 52 of the clutch/brake coupling 16 is braked, i.e., prevented from rotating, and the clutch portion thereof is disengaged, the drive gear 102 and the output shaft 18 are prevented from rotating. In this case, when the motor 14 drives the drive gear 98, the lead nut 96 threadably advances the lead screw portion 80 of the output shaft 18 resulting in translational movement of the output shaft 18. In this case, the second portion 82 of the output shaft 18 slidingly advances through the bore within the bushing 100 resulting in translational movement, without rotational movement, of the output shaft 18. Thus, it is apparent that both rotational and translational movement of the output shaft 18 can be accomplished through the use of a single drive motor 14 and selective actuation of the clutch/brake coupling 16.

Figure 4:
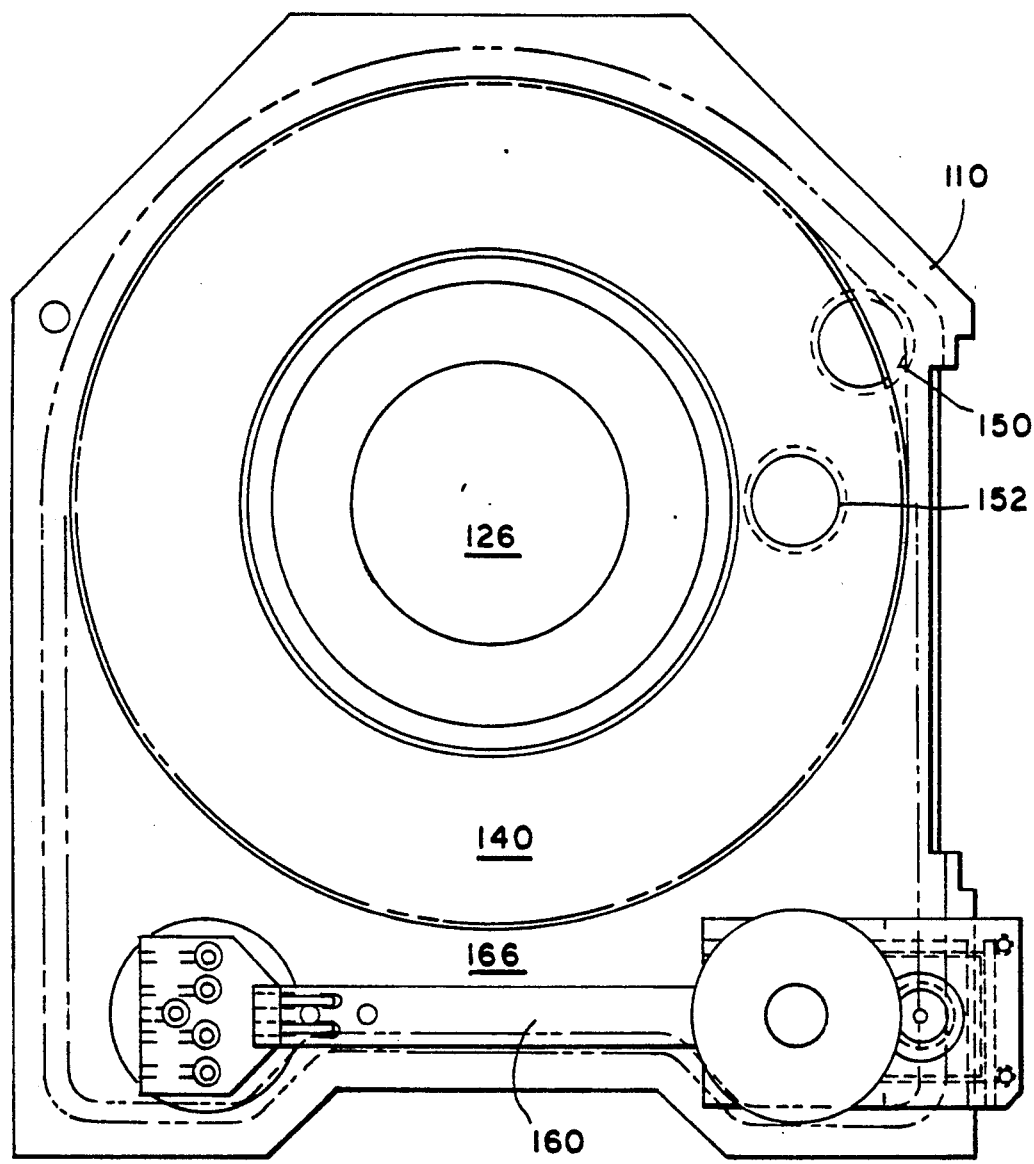
FIG. 4 is a top plan view of the present invention showing its use in conjunction with the process module, as illustrated in FIG. 3.
Figure 5:
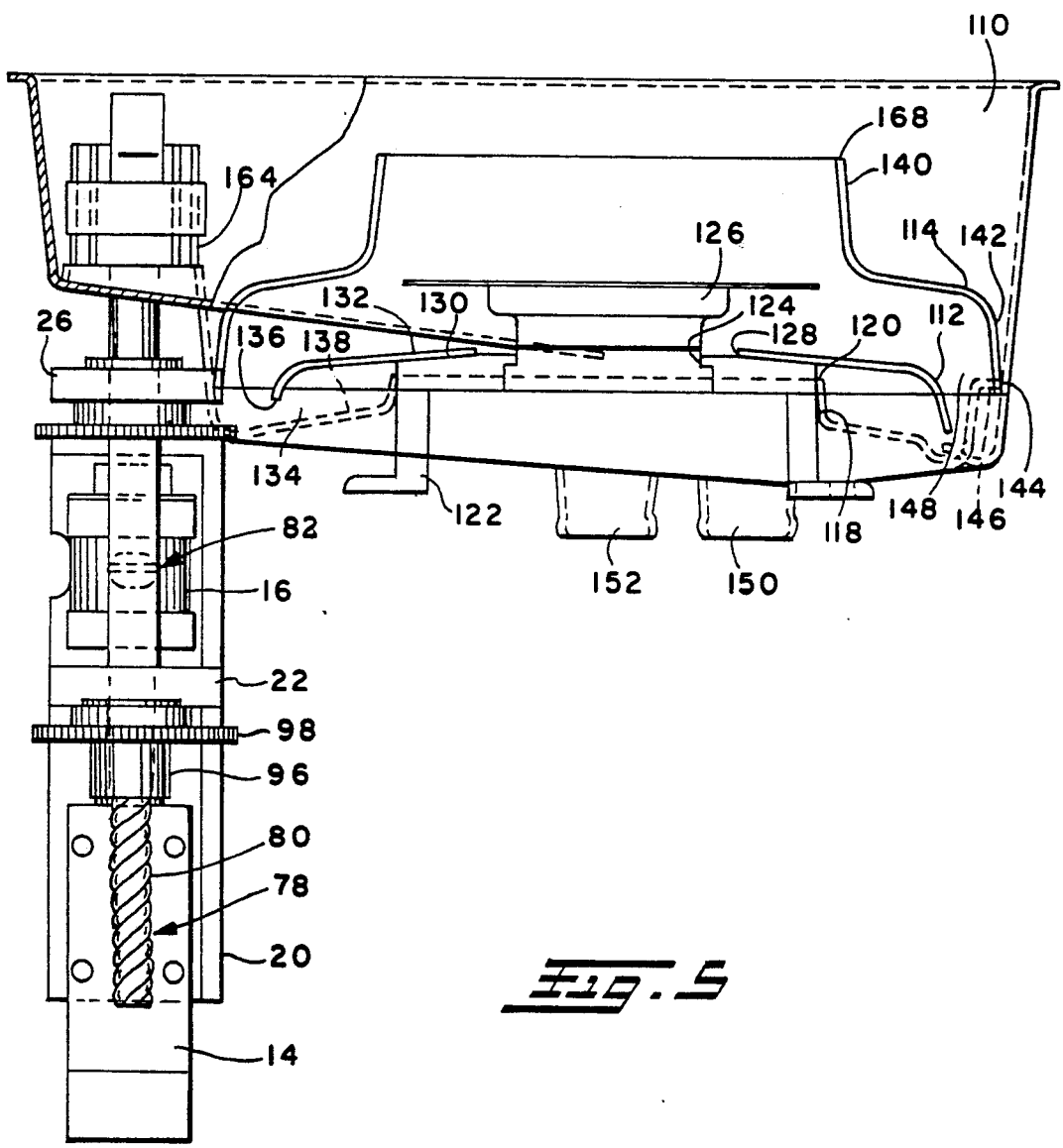
FIG. 5 is a side view of the present invention, partially broken away in cross section, showing its use in conjunction with the process module, as illustrated in FIG. 3.

Referring now to FIGS. 3 through 5, the utilization of the drive mechanism 10 in conjunction with a process module in a wafer processing system is illustrated. A multi-sided process module tub 110 receives a baffle 112 and a spin deflector 114 therein, both having a disk-shaped configuration. The bottom 116 of the tub 110 includes a tapered circumferential neck portion 118 defining an aperture 120 which receives a cylindrical seal support 122 having an aperture 124 therein. A rotatable vacuum chuck 126 associated with a process module is received through aperture 124 in seal support 122. The baffle 112 has an aperture 128 therein permitting its receipt over the chuck 126. The bottom surface 130 of the baffle 112 contacts the top surface 132 of the seal support 122. A circumferential gap 134 is provided between the edge 136 of the baffle 112 and inner surface 138 of the tub 110. The spin deflector 114 includes a tapered circumferential neck portion 140 which joins a flared circumferential portion 142 whose edge 144 is supported for a portion of its circumferential length by a shoulder 146 provided in tub 110 resulting in the formation of an annular gap 148 between the inner surface of spin deflector 114 and the outer surface of the baffle 112. The tub 110 includes a liquid drain port 150 and a gas exhaust port 152 in the bottom 116 thereof. The bottom 116 of the tub 110 also includes an aperture 154 having a diameter greater than the diameter of third portion 84 of output shaft 18 of the drive mechanism 10 permitting its receipt therethrough. The end 156 of the third portion 84 of output shaft 18 is received through a bore 158 in an end of a dispense arm 160 having dispensing tubes 162 attached to the top surface thereof. The ends 164 of the dispensing tubes 162 adjacent the opposite end of the dispense arm 160 may have nozzles provided therein. The axial length of the dispense arm 160 is such that when the arm 160 is rotated, the ends 164 of the dispensing tubes 162 pass over the approximate center of the vacuum chuck 126. As can be seen in FIG. 4, when the arm 160 is stored in the neutral position, it occupies an area, shown generally by the numeral 166, outside the wafer processing environment so as not to disrupt air flow within the processing zone.

Operationally, when it is desired to dispense a fluid onto a wafer supported on the vacuum chuck 126, the output shaft of the clutch/brake coupling 16 is braked and the clutch portion thereof is disengaged. Actuation of the motor 14 causes its rotation in a first direction resulting in the output shaft 18 and the dispense arm 160 moving upwardly from the neutral area 166. When the bottom surface of the dispense arm 160 is above the circumferential end 168 of the tapered circumferential neck portion 140 of the spin deflector 114, the motor 14 is stopped. The clutch portion of the clutch/brake coupling is then engaged and brake portion thereof is disengaged to switch from translational movement of the output shaft 18 and the dispense arm 160 to rotational movement thereof. The motor 14 is then actuated to rotate the dispense arm 166 over the spin deflector 114. The motor 14 is stopped, the output shaft of the clutch/brake coupling 16 is braked and the clutch portion thereof is disengaged. The motor 14 is again actuated causing the dispense arm 160 and the dispensing tubes 162 attached thereto to move downwardly to the desired dispense height. When the desired dispense height has been achieved, fluids are dispensed through the dispensing tubes 162 to the wafer on the chuck 126. During fluid dispensing, the dispense arm 160 can be rotated or translated, and the chuck 126 with the wafer thereon can be rotated or oscillated. After fluid dispensing has been completed, the chuck 126 with the wafer thereon is rotated through selected accelerations and speeds to spread the fluid on the wafer or to remove same from the surface of the wafer, as required. Fluids leaving the surface of the wafer contact the inner surface of the spin deflector 114. The deflected fluids traverse downwardly over the inner surface of the spin deflector 114 to the bottom 116 of the tub 110 where they pass through liquid drain port 150 for removal from the process module. Exhaust air flows inwardly through the tapered circumferential neck portion 140 of the spin deflector 114, through the area defined by the flared circumferential portion 142 of the spin deflector 114 and the baffle 112, through the annular gap 148 between the inner surface of the spin deflector 114 and the outer surface of the baffle 112, and through the circumferential gap 134 between the edge 136 of the baffle 112 and the inner surface 138 of the tub 110 to the gas exhaust port 152 in the bottom 116 of the tub 110.

After the fluids have been dispensed and spread over to the surface of the wafer, the foregoing procedure for movement of the dispense arm 160 is reversed. That is, the output shaft of the clutch/brake coupling 16 is braked and the clutch portion thereof is disengaged. The motor 14 is then actuated causing the dispense arm 160 to move upwardly. When the bottom surface of the dispense arm 160 is above the circumferential end 168 of the tapered circumferential neck portion 140 of the spin deflector 114, the motor 14 is stopped. The clutch portion of clutch/brake coupling 16 is then engaged and the brake portion thereof is disengaged. Actuation of the motor 14 causes the output shaft 18 and the dispense arm 160 to rotate toward the neutral area 166. When the dispense arm 160 is adjacent the neutral area 166, the motor 14 is stopped. The clutch/brake coupling 16 is then braked and the clutch portion thereof is disengaged. Actuation of the motor 14 causes the output shaft 18 and the dispense arm 160 to move downwardly into the neutral area 166 in the tub 110. In this manner, the dispense arm 160 is stored in a location outside the wafer processing environment so as not to disrupt air flow within the processing zone.

From the foregoing, it is apparent that the ability of the drive mechanism to provide both rotational and vertical translation of the arm permits the use of the arm without structural modification of the spin deflector and associated baffling in the process area. In addition, it should be noted that the drive mechanism is programmable with respect to various dispense parameters, such as dispense arm position, height and the dynamic dispensing of fluids. With respect to the latter parameter, i.e., dynamic dispensing of fluids, this parameter can be programmed for an arm sweep of the wafer surface. Thus, the arm sweep can include acceleration, if desired, to satisfy "fluid per area" application techniques. In essence, any movement profile can be programmed into the drive mechanism and thus control the movement of the dispense arm. As for the vertical translation parameter, this parameter can be readily varied to optimize dispense height for a given process. Since height of the dispense arm is a programmable feature, rapid iterations can be performed without cumbersome mechanical adjustments of the arm. In addition, this vertical translation feature permits the use of multiple dispense heights, or even a dynamically changing dispense height, as part of the dispensing process. Lastly, the foregoing programmable features permit a combination of multiple dispensing techniques and repeatable return to prior techniques without mechanical adjustments.

I claim:

1. Apparatus for dispensing fluid onto a wafer in a wafer processing system comprising:
   a prime mover;
   a clutch/brake device operatively connected to said prime mover;
   an output shaft operatively connected to said clutch/brake device, said output shaft being rotatable in a first direction when said clutch/brake device is in a first mode of operation and said prime mover is rotating in a first direction and being rotatable in the opposite direction when said clutch/brake device is in said first mode of operation and said prime mover is rotating in the opposite direction, said output shaft being translatable in a first direction when said clutch/brake device is in a second mode of operation and said prime mover is rotating in said first direction and being translatable in a second direction when said clutch/brake device is in second mode of operation and said prime mover is rotating in said opposite direction; and
   means for directing fluid onto the wafer, said fluid directing means being operatively connected to said output shaft.

2. The apparatus as defined in claim 1 wherein said clutch/brake device includes a clutch portion and a brake portion, said clutch portion having an input shaft provided thereto, said brake portion having an output shaft provided therefrom.

3. The apparatus as defined in claim 2 wherein said clutch portion of said clutch/brake device is engaged and said brake portion thereof is disengaged when said clutch/brake device is in said first mode of operation.

4. The apparatus as defined in claim 2 wherein said input shaft and said output shaft of said clutch/brake device are operatively interconnected when said clutch/brake device is in said first mode of operation.

5. The apparatus as defined in claim 2 wherein said brake portion of said clutch/brake device is engaged and the clutch portion thereof is disengaged when said clutch/brake device is in said second mode of operation.

6. The apparatus as defined in claim 2 wherein said input shaft to said clutch/brake device is permitted to rotate and said output shaft from said clutch/brake device is prevented from rotating when said clutch/brake device is in said second mode of operation.

7. The apparatus as defined in claim 1 wherein said fluid directing means includes an arm operatively connected to said output shaft so as to be rotatable and translatable in response to the rotation and translation of said output shaft, and fluid dispensing means operatively connected to said arm.

8. Apparatus for dispensing fluid onto a wafer in a wafer processing system comprising:
   a prime mover;
   a clutch/brake device operatively connected to said prime mover, said clutch/brake device including a clutch portion and a brake portion;
   an output shaft operatively connected to said clutch/brake device, said output shaft being rotatable in a first direction when said clutch/brake device is in a first mode of operation and said prime mover is rotating in a first direction and being rotatable in the opposite direction when said clutch/brake device is in said first mode of operation and said prime mover is rotating in the opposite direction, said clutch portion of said clutch/brake device being engaged and said brake portion thereof being disengaged when said clutch/brake device is in said first mode of operation, said output shaft being translatable in a first direction when said clutch/brake device is in a second mode of operation and said prime mover is rotating in said first direction and being translatable in a second direction when said clutch/brake device is in said second mode of operation and said prime mover is rotating in said opposite direction, said brake portion of said clutch/brake device being engaged and said clutch portion thereof being disengaged when said clutch/brake device is in said second mode of operation; and
   means for directing fluid onto the wafer, said fluid directing means being operatively connected to said output shaft.

9. The apparatus as defined in claim 8 wherein said fluid directing means includes an arm operatively connected to said output shaft so as to be rotatable and translatable in response to the rotation and translation of said output shaft, and fluid dispensing means operatively connected to said arm.

* * * * *